United States Patent
Huneke

(10) Patent No.: US 8,399,974 B1
(45) Date of Patent: Mar. 19, 2013

(54) METHODS OF DICING STACKED SHINGLED STRIP CONSTRUCTIONS TO FORM STACKED DIE PACKAGES

(75) Inventor: James T. Huneke, Irvine, CA (US)

(73) Assignee: Henkel Corporation, Rocky Hill, CT (US)

( * ) Notice: Subject to any disclaimer, the term of this patent is extended or adjusted under 35 U.S.C. 154(b) by 713 days.

(21) Appl. No.: 12/500,415

(22) Filed: Jul. 9, 2009

Related U.S. Application Data

(60) Provisional application No. 61/079,685, filed on Jul. 10, 2008.

(51) Int. Cl.
*H01L 23/02* (2006.01)

(52) U.S. Cl. .................. 257/686; 257/E23.085

(58) Field of Classification Search .......... 257/686, 257/730, 777, E23.085, E25.006, E25.013
See application file for complete search history.

(56) References Cited

U.S. PATENT DOCUMENTS

| | | | |
|---|---|---|---|
| 5,495,398 A | 2/1996 | Takiar et al. | |
| 6,376,904 B1 | 4/2002 | Haba et al. | |
| 6,514,794 B2 | 2/2003 | Haba et al. | |
| 6,621,155 B1 | 9/2003 | Perino et al. | |
| 6,756,305 B1* | 6/2004 | Conn ............................. | 438/667 |
| 6,900,528 B2 | 5/2005 | Mess et al. | |
| 7,217,596 B2 | 5/2007 | Cobbley et al. | |
| 7,755,204 B2* | 7/2010 | Cobbley et al. ............... | 257/782 |
| 2008/0054432 A1 | 3/2008 | Corisis et al. | |

OTHER PUBLICATIONS

Cleaving Strips of Die From a Wafer in GaN Laser Manufacturing published in *Compound Semiconductor*, pp. 16-17 (2005).
III-V/Si Photonics by Die-to-Wafer Bonding published in *Materials Today*, vol. 10, 7-8 (2007).

* cited by examiner

*Primary Examiner* — Quoc Hoang
(74) *Attorney, Agent, or Firm* — Steven C. Bauman

(57) ABSTRACT

A method of forming a bonded shingle stacked die package is provided. The method includes providing a wafer, singulating the wafer into a plurality of strips, applying to at least a portion of at least one mating surface of each of the plurality of strips a material capable of reacting with the other mating surface, stacking the plurality of strips in an overlapping stair-step configuration, exposing the stacked strips to conditions sufficient to bond the plurality of strips together, and dicing the stacked strips into individual die shingle stack configurations.

4 Claims, 3 Drawing Sheets

METHODS OF DICING STACKED SHINGLED STRIP CONSTRUCTIONS TO FORM STACKED DIE PACKAGES

RELATED U.S. APPLICATION DATA

This application claims priority to U.S. Provisional Application No. 61/079,685, filed Jul. 10, 2008, the disclosure of which is hereby expressly incorporated herein by reference.

BACKGROUND OF THE INVENTION

1. Field of the Invention

The present invention relates to a method of making a shingle stacked die package and, more particularly, to a method of making shingle stacked die packages having a reduced number of processing steps wherein the die are attached by either a thin layer of adhesive or a molecular bonding process to produce an essentially zero bond-line between the bonded die.

2. Brief Description of Related Technology

The use of integrated circuit (IC) chips or dice is widespread in electronics applications. Continuing progress in the manufacture of IC chips has resulted in chips of greatly increased density, i.e., a higher number of semiconductor die per footprint area of each chip. In order to produce increasingly complex electronic structures exhibiting high circuit densities, it has become common practice to stack dice on a lead frame die paddle to create what is known in the art as a multi-chip package or multi-chip module (MCM). A variety of multi-chip package designs are described in U.S. Pat. Nos. 6,514,794 and 6,376,904 each to Haba et al., U.S. Pat. No. 6,621,155 to Perino et al., U.S. Pat. No. 5,495,398 to Takiar et al., U.S. Pat. No. 6,900,528 to Mess et al, and United States Patent Publication No. 2008/0054432 to Corisis et al.

Shingle stack configuration is known in the industry to be an optimum way to achieve a high number of dice in a stack. In a shingle stack, the die overlap, forming a staircase in which the "step" of every die contains the exposed wire bond pads. Typically these stacks are formed by singulating, handling and placing every die one-by-one in a shingle stack assembly. Because of the multiple handling steps of the individual die, this process can be time-consuming and expensive, and can result in damage to the die and/or wafer. As discussed in U.S. Pat. No. 7,217,596, one technique for forming a stacked die module includes providing a stacking tip and sequentially stacking adhesively coated precut die by a "top down" sequence into the stack prior to coupling the die stack to a substrate. These die may be stacked according to a variety of designs including a wedding cake/pyramid design and/or a shingle stacked design. A disadvantage of this process is that it still requires multiple processing and handling steps as the die are individually cut and singly joined with one another.

Cleaving strips of die from a wafer and stacking them is known in the process for coating the mirrors in GaN laser manufacturing. As discussed in the article "Cleaving Strips of Die From a Wafer In GaN Laser Manufacturing" published in *Compound Semiconductor*, July 2005, pages 16-17, this process includes coating the exposed edges of the stacked strips to form the mirrors, unstacking the strips for testing, and then cutting the strips into separate die.

Semiconductor die or chips are typically produced from a wafer containing a plurality of individual circuits spaced apart by streets. During the back end processing phase of the packaging portion of the production, this wafer is cut along the streets into individual die, which are then stacked and bonded to one another and/or to a substrate. This bonding is typically achieved through the use of a paste-type adhesive. This paste-type adhesive would be dispensed onto a die, a second die would be positioned thereon and the adhesive cured. Problems associated with the use of paste adhesives, such as unwanted flowing of the adhesive, caused the industry to develop alternative bonding methods. These alternative bonding methods include the use of pressure sensitive adhesives or film adhesives mounted on a carrier tape. The use of the adhesives currently in the market typically produce a bond-line thickness of approximately 25 μm between the die.

Semiconductor fabrication generally involves two types of operations: front end processing and back end processing. The "front end" processing typically refers to the steps involved with creating the circuitry prior to individualizing the integrated circuit chips, such as formation of transistors directly on the silicon wafer, surface engineering including formation of gate dielectric such as silicon dioxide, and interconnecting electrical circuits to form individual integrated circuit chip dies. The "back end" processing involves packaging of the individual chip dies thus formed. This is typically accomplished by mounting the die to a substrate such as a circuit board, and/or mounting a number of die to each other in the stacked die construction. Such mounting traditionally involves electrically connecting pads on the die to pads on the substrate to form the package such as through wire bonding. Typically adhesives are used for mounting the die to the substrate or another die. Additional adhesive materials are used to encapsulate the final construction in order to create the integrated package.

In view of the ever-decreasing size of circuits, new techniques are constantly being developed for decreasing chip thicknesses and producing more compact electrical components. Thus, there is a need for processes that enable the stacking of more die in a limited amount of vertical height. One way this can be achieved is by making the die thinner than previously used, even as thin as 2 μm. With the chip thickness being decreased, the bonding of the chips together must also be decreased. This is difficult to achieve through the use of traditional adhesives and bonding techniques currently in employed in this industry.

Bonding techniques to produce essentially zero bond-lines are known in the semi-conductor wafer processing industry in the "front end" processing of the semiconductor wafer in the area of photonics. As stated above, "front end" processing refers to the steps involved with creating the circuitry prior to individualizing the integrated circuit chips. Photonic integrated circuits offer the potential of realizing low-cost, compact optical functions. As discussed in the article entitled "III-V/Si Photonics by Die-to-Wafer Bonding" published in *Materials Today*, July-August 2007, Volume 10, Number 7-8, there are three main routes to the integration of III-V material on top of an SOI (silicon-on-insulator) layer, namely, flip-chip integration, heteroepitaxial growth, and bonding technology. The flip-chip technique has disadvantages in terms of processing times and production costs. The heteroepitaxial growth technique has encountered problems in terms of limited integration density and is hampered by the large lattice mismatch of 8% between the III-V material and the Si host substrate. This leads to large threading and misfit dislocation densities in the grown layers and deterioration of the optical properties. The final route, semiconductor wafer bonding, allows the integration of high-quality III-V epitaxial layers on top of a Si platform by transferring the III-V layer stack from its original growth substrate to the SOI wafer. To decrease the cost of the integration process, in terms of both time and consumption of expensive III-V material, a die-to-wafer bonding process has been proposed in which unprocessed InP/InGaAsP dies are bonded, epitaxial layers down, to the processed SOI wafer. This technique reduces material consumption, as III-V semiconductors are only bonded where they are needed, and reduces the time required to complete the integration process compared with a flip-chip process as only limited alignment accuracy is needed. The article discusses two techniques for semiconductor wafer bonding that have been investigated. The first of these techniques is through the use of a thermosetting polymer adhesive acting as a bonding agent. The second technique utilizes molecular bonding between the layers. In this second technique, the SOI (silicon-on-insulator) wafer surface is coated with an $SiO_2$ cladding layer and planarization is achieved by chemical mechanical polishing (CMP). Subsequently, the III-V epitaxial layer structure is coated with $SiO_2$ and, if needed, a touch-polish (CMP) polishing step can be used to reduce the surface microroughness to an amount necessary to achieve molecular bonding. The surfaces of both wafers must be in contact on the atomic scale, which requires a root mean squared microroughness of approximately 0.5 nm to achieve molecular adhesion. After surface planarization and reduction of the microroughness, both wafer surfaces are chemically activated to make them hydrophilic. This can be achieved by wet chemical treatment or plasma activation. Van der Waals interactions between both surfaces is achieved when the two activated wafer surfaces are attached to each other because of the presence of a water interface layer, which is readily adsorbed at the wafer surface. During high temperature annealing of the bonded stack, water molecules are removed from the bonding interface, leaving a covalent bond between the $SiO_2$ surfaces. This process requires high temperature processing in excess of 300° C. to drive the moisture or water out during the annealing process to form a SiO/Si ceramic or inorganic bond.

As shown in FIG. 1, a conventional process includes cleaving strips 12 of die 14 from a wafer 10 and stacking the strips 16. As discussed in the article "Cleaving Strips of Die From a Wafer In GaN Laser Manufacturing" published in *Compound Semiconductor*, July 2005, pages 16-17, this process includes coating the exposed edges 18 of the stacked strips 16 to form the mirrors, unstacking the strips for testing 20, and then cutting the strips 16 into separate die 22.

During the "back end" processing and packaging of semiconductor die, high temperature processing must be avoided. Temperatures in excess of 200° C., and in some instances greater than 175° C., can cause damage to the substrate and undesirable solder reflow of the solder balls placed on the ball-grid-array (BGA) used for interconnecting with the circuit board substrate. Accordingly, conventional molecular bonding techniques involving high temperatures, such as those described for use in the front end wafer processing, cannot be used in the back end die attach/packaging processing.

There is a need in the art to replace the process steps of singulating, handling, and placing every die one-by-one in a shingle stack assembly with a more time efficient process of stacking of strips and then cutting into individual die stacks, which reduces the amount of handling of the individual die. There is a further need in the art for a "back-end" processing environment to produce a molecular bond having a thin (0.1-5 µm) bond-line thickness between the die, thereby increasing the number of die in a stack within a limited amount of vertical height.

SUMMARY OF THE INVENTION

According to a first aspect of the invention, a method of forming a bonded shingle stacked die package is provided. The method includes providing a wafer, singulating the wafer into a plurality of strips, applying to at least a portion of at least one mating surface of each of the plurality of strips a material capable of reacting with the other mating surface, stacking the plurality of strips in an overlapping stair-step configuration, exposing the stacked strips to conditions sufficient to bond the plurality of strips together, and dicing the stacked strips into individual die shingle stack configurations. The material capable of reacting with the other mating surface of the plurality of strips can include a heat curable material or a composition containing a labile hydrogen group.

When using a labile hydrogen group, the conditions sufficient to bond the plurality of strips together includes applying heat at a temperature sufficient to cause the labile hydrogen of the material coated on the at least one mating surface to react with the at least other mating surface of the strip. Depending upon the type of material used for coating the strips, the resulting bond between the stacked strips can have a molecular bond-line thickness of approximately 5 µm or less or in the range of 0.1-5 µm, allowing for a greater number of strips to be placed within a limited vertical height requirement.

According to another aspect of the invention, a bonded shingle stacked die package is provided. The shingle stacked die package includes a plurality of individual die stacked in a shingle configuration and a labile containing chemical coating located between each of the individual die to form a covalently bonded assembly. The individual die of the stacked die package have a molecular bond-line thickness there between of approximately 5 µm or less, or within the range of 0.1-5 µm, and the die package includes eight or more die per stack.

These and other features and characteristics of the present invention, as well as the method of operation and functions of the related elements of structures and the combination of parts and economies of manufacture, will become more apparent upon consideration of the following description with reference to the accompanying drawings, all of which form a part of this specification, wherein like reference numerals designate corresponding parts in the various figures.

DETAILED DESCRIPTION OF THE INVENTION

Figure 1:
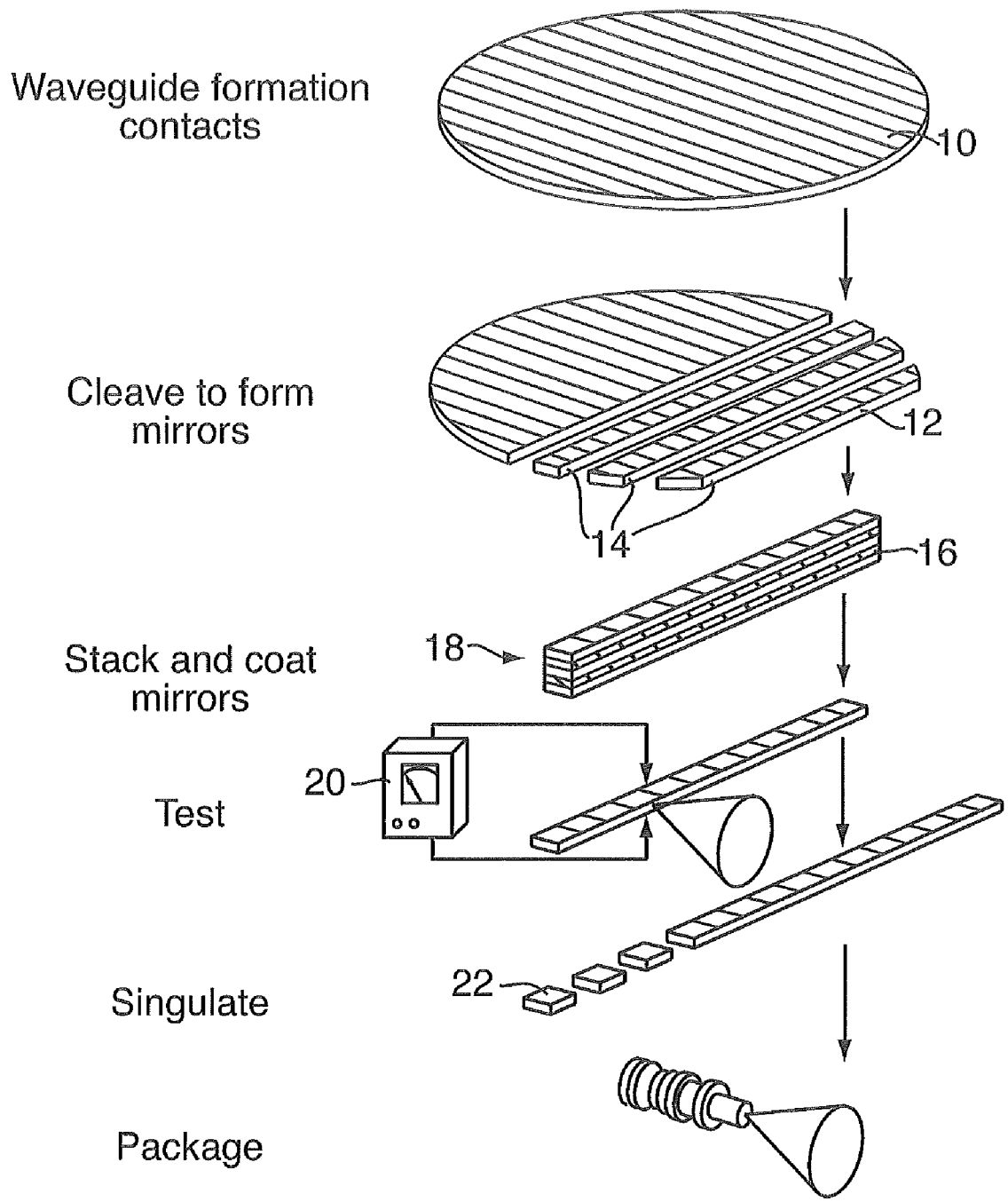
FIG. 1 is a conventional process for making edge emitting diode lasers.

For purposes of the description hereinafter, the terms "upper", "lower", "right", "left", "vertical", "horizontal", "top", "bottom", "lateral", "longitudinal" and derivatives thereof shall relate to the invention as it is oriented in the drawing figures. However, it is to be understood that the invention may assume various alternative variations, except where expressly specified to the contrary. It is also to be understood that the specific devices illustrated in the attached drawings, and described in the following specification, are simply exemplary embodiments of the invention. Hence, specific dimensions and other physical characteristics related to the embodiments disclosed herein are not to be considered as limiting.

Figure 2:
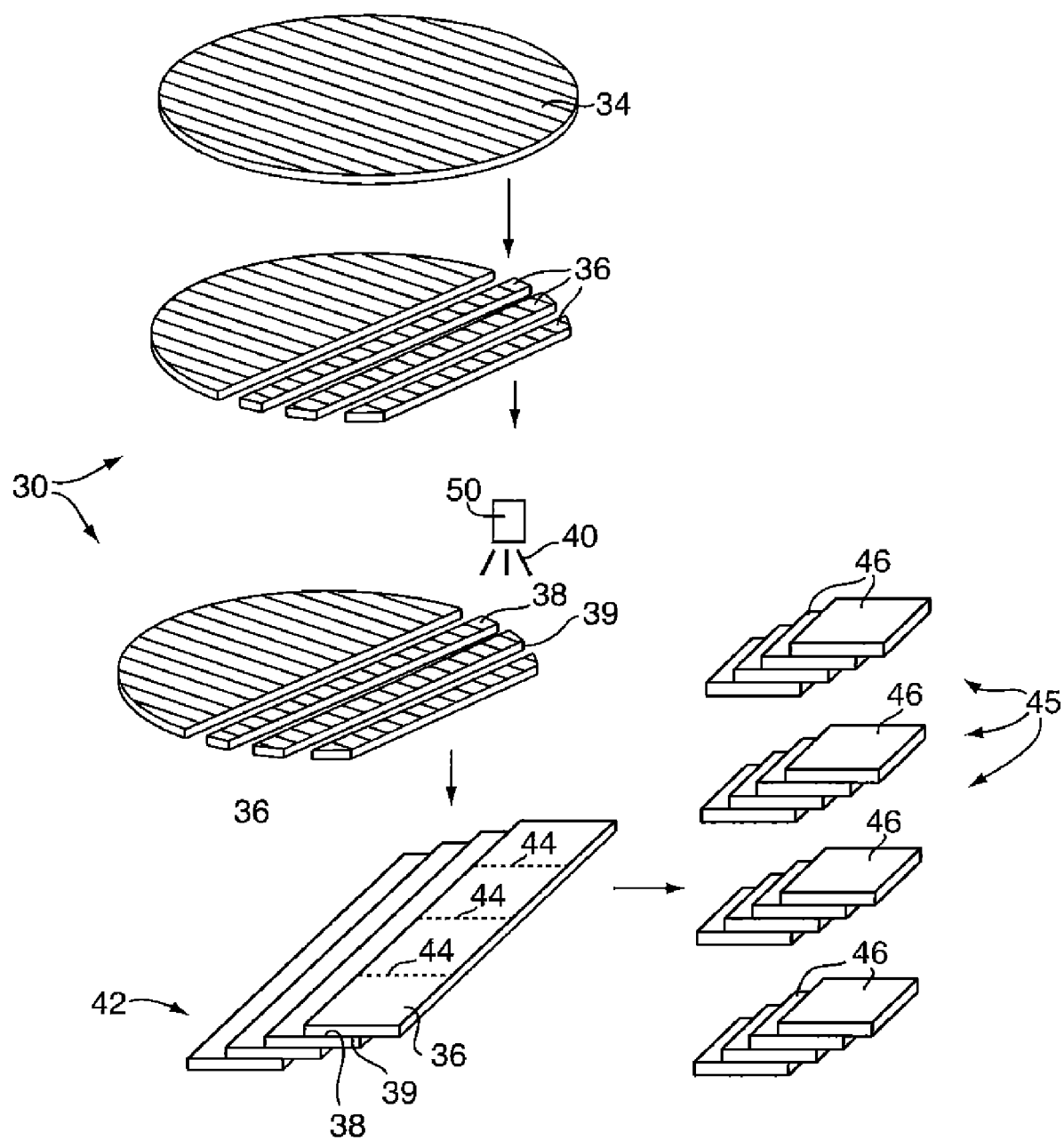
FIG. 2 is a schematic representation of the process for making the stacked die package according to the present invention.

Reference is now made to FIG. 2 which shows a shingle stack process, generally indicated as 30 according to the present invention. The method of forming the shingle stacked die package comprises providing a wafer 34, preferably a silicon wafer, and singulating the wafer 34 into a plurality of strips 36. Singulating the wafer 34 includes the steps of cleaving, sawing, and snapping the wafer into the plurality of strips.

The method further includes applying to at least a portion of at least one mating surface 38 of each of the plurality of strips 36 a material 40 capable of reacting with the other mating surface 39 of another strip 36. After applying material 40, the method further includes stacking the plurality of strips 36 in an overlapping stair-step configuration, as generally illustrated by 42, exposing the stacked strips to conditions sufficient to bond the plurality of strips 36 together; and dicing the stacked strips along lines 44 into individual die shingle stack configurations, as generally illustrated by 45. The resulting shingle stack configurations 45 are comprised of a plurality of individual die 46.

Figure 3:
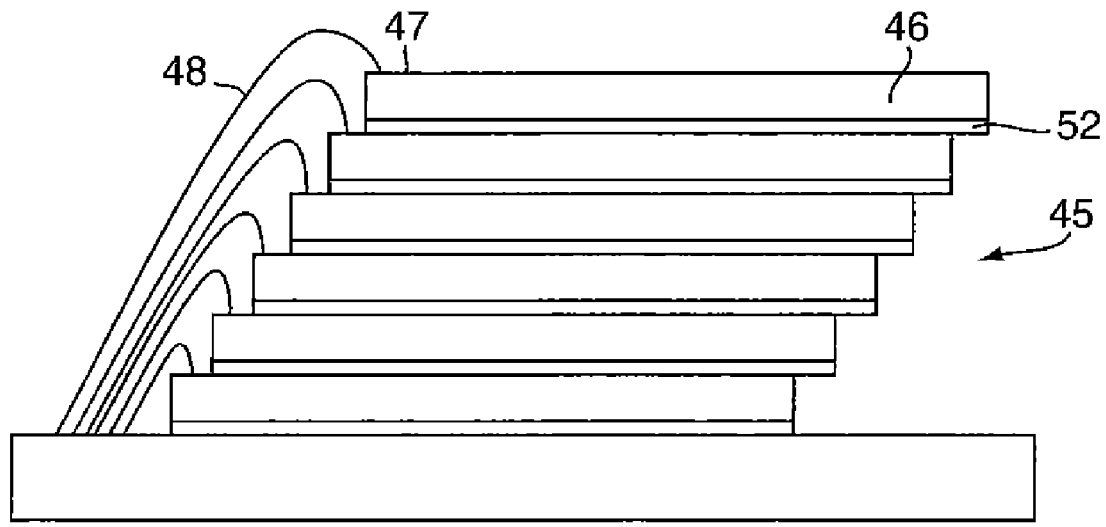
FIG. 3 is a side view representation of a series of shingle stacked die bonded according to a first aspect of the process of the present invention.

A single stack configuration 45 is an optimum way to achieve a high number of die 46 in a stack. In a shingle stack 42, the die 46 overlap, forming a staircase, in which the "step" of every die 46 contains the exposed wire bond pads 47 attached to wires 48, as shown in FIG. 3. Packages can be made this way containing eight, sixteen, or more die in the stack, especially as wafer thinning technology advances from 75 µm to 25 µm or less thickness. The present invention improves the efficiency of forming shingle stacks 45 by stacking strips 36, rather than individual die 46, and then dicing the stacked strips 36 into individual shingle stack configurations 45. Also, the chance of damaging the fragile die is reduced as the die 46 are not individually handled.

As discussed above, the semiconductor industry continues to demand thinner and more compact electrical components. By reducing the bond-line thickness between the die, smaller stacks having a greater number of die can be produced. The present invention achieves this reduced bond-line thickness by a series of steps as disclosed above wherein the shingle stacked die can be adhered by a molecular bonding process which results in a bond-line thickness of approximately 0.1-5 µm or less.

According to a first aspect of the invention, as shown in FIG. 3, the chemical material used for coating at least one mating surface of each of the plurality of strips 46 is a heat curable composition, a heat curable composition in one part, a curable composition in two parts, and/or a curable composition in one part and an activator in a second part. In this process, the mother wafer 34 can be planarized with a spin coated polymer 52 which is heat activated to become the adhesive for the die bonding. A non-optically pure, lower temperature curing bonding material can be used for joining the die strips 36.

Figure 4:
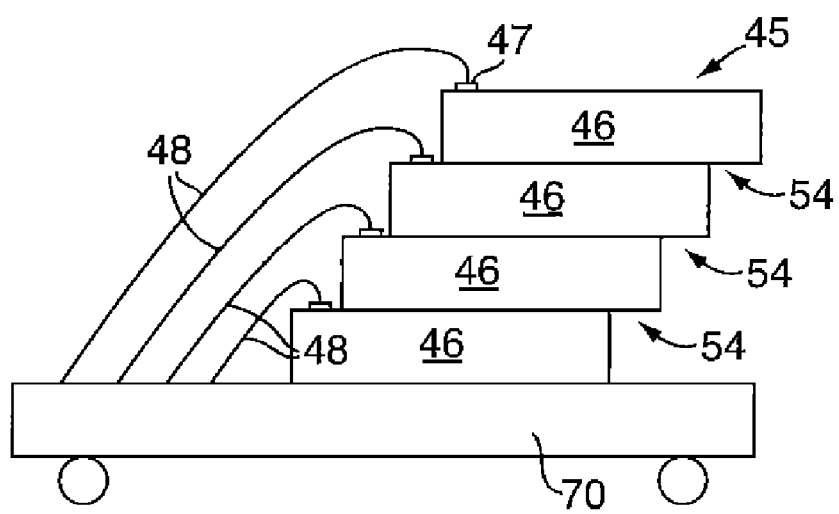
FIG. 4 is a side view representation of a series of shingle stacked die molecularly bonded according to a second aspect of the process of the present invention.

According to another aspect of the invention, as shown in FIG. 4, a covalent bond can be formed between the strips 36 to produce a bond-line thickness of 5 µm or less or within the range of 0.1-5 µm. For purposes of this invention, the bond-line thickness, generally indicated as 54 between the mating surfaces of the die 46 is considered a zero bond-line thickness because after processing, i.e., after a chemical reaction occurs between the die strips, the mating surfaces of the die strips are essentially in direct contact with one another and the nature of the bond between the substrates is monolithic, such as through a direct covalent bond between the surfaces. In other words, the final product is one integral structure as opposed to separate strips joined together with a separate adhesive layer located there between.

As stated above, the formation of these die stacks occur at the "back end" processing and packaging of the die. Accordingly, care must be taken to avoid exposing the stacks to high temperatures, such as in excess of approximately 200° C., and in some instances in excess of approximately 175° C., as these high temperatures can cause damage to the die and undesirable solder reflow of the solder balls 47 placed on the ball-grid-array (BGA) used for attaching the wires 48 to the circuit board, as shown in FIG. 4.

The individual chip die 46 are typically constructed from silicon wafers 34 during the "front end" processing discussed above. The chip die may be constructed of any material known in the art. For example, the chip die may be constructed of one or more materials selected from the group consisting of silica, silicon, silicon oxide, silicon dioxide, silicon carbide, gallium, gallium arsenide, gallium phosphide, indium, indium phosphide, indium arsenide, zinc oxide, antimonide, $Al_2O_3$, $SiN_3$, mullite ($Al_2O_3$—$SiO_2$), sapphire, and germanium oxide. The chip die may also be coated with a material which is capable of passivating environmental corrosion, such as a polyimide-, poly-benzocyclobutane-, or silicone nitride-based material. It is also contemplated that the silicon wafer may have undergone processing to impart specific characteristics to the wafer, such as silicone-germanium deposition, silicon-on-insulator deposition, and the like. Additionally, formation of an insulating material or gate dielectric, such as $SiO_2$, typically occurs during the "front end" processing, thereby rendering at least a portion of the surface of the chip die as having a silicon oxide surface. Accordingly, the surfaces of the die strips 36 may be formed of a silicon oxide material.

In embodiments where the stacked die packages are to be bonded to a circuit board substrate, such as 70 in FIG. 4, the circuit board substrate may be constructed of any material known in the art. For example, the substrate may be constructed from ceramic substrates, substrates or tapes of heat-resistant resins, substrates of glass-reinforced epoxy, phenolic substrates, and the like. Examples of useful materials include, but are not limited to silica, silicon, silicon oxide, silicon dioxide, silicon carbide, gallium, gallium arsenide, gallium phosphide, indium, indium phosphide, indium arsenide, zinc oxide, antimonide, $Al_2O_3$, silicon nitride ($SiN_3$), mullite ($Al_2O_3$—$SiO_2$), polyimides, epoxies, phenolics, cyanate esters, bismaleimides, and acrylonitrile-butadiene-styrene (ABS).

The chip die includes circuitry on a chip surface thereof, including a plurality of electrical contact pads, such as metalized contact pads which are arranged in a predetermined pattern, as is known in the art. These electrical contact pads are arranged to receive a plurality of corresponding electrical contacts in the form of an electrical interconnect, such as solder bumps connected to the contact pads of the chip die 46. Other forms of electrical interconnect are also contemplated, such as gold, silver-paste, and the like. Further, the substrate includes electronic circuitry on a substrate surface thereof, including a plurality of electrical contact pads, which are typically copper, gold-plated copper, and the like. Each of the solder pads of the substrate and the solder bumps of the chip die are metalized so as to become solderable and electrically conductive, thus providing electrical interconnection between the circuitry on the chip die and the circuitry on the substrate when the integrated circuit chip is mounted on the substrate. The solder bumps 47 may be applied to the chip die in any manner as is known in the art, and may incorporate any known solder alloy or metal, provided that such solder is flowable upon heating. It is additionally contemplated that a polymeric material which is electrically conductive may be used as the solder bumps to impart electrical conductivity to the chip or die surface, as well as the substrate. This polymeric material can include thermosetting and thermoplastic materials and combinations thereof, as well as, metal/polymeric composite materials.

The electrically conductive material is a thermally sensitive material. For purposes of this invention, thermally sensitive material is defined as material which, when exposed to a certain threshold temperature, the physical structure and/or chemical structure of the material is affected thereby transitioning the material to a different state. Changes in physical structure can include melting, flowing, and the like. Changes in chemical structure can include curing of the polymeric and/or composite material and the like. In the present invention, heating of the substrates to cause bonding of the substrate surfaces must occur at a temperature which is below a transition temperature of the thermally sensitive material at which damage to the electrical conductivity of the resultant product is affected, thereby compromising the integrity of the device. In certain embodiments, this temperature does not exceed approximately 200° C., or even approximately 175° C.

Prior to bringing the mating surfaces of the strips 36 together, at least one surface is pretreated. The thin bond-line mating of the strips 36 of the present invention contemplates essentially direct contact the mating portions of the strips 36. Surface characteristics can therefore play a role in effecting a more complete bond, by ensuring direct physical contact between the surfaces. Prior to bonding the strip surfaces, it is desirable to ensure that the surfaces to be interconnected are physically compatible. This may be accomplished, for example, through a planarization process as indicated by step 22 in FIG. 1, in which the corresponding surfaces of the substrates are planarized to form essentially flat surfaces. Such planarizing can be accomplished by any well known technique, such as by oxide deposition, chemical polishing, back grinding, and the like.

Subsequent to the planarizing step, at least one surface is further pretreated to render the surface reactive. This may be accomplished by coating the surface with a chemical agent or composition, as indicated by step 24 in FIG. 1. It is also contemplated that such a chemical coating step can be accomplished without the planarizing step. Such pretreating to render the surface reactive may involve processing steps that are capable of rendering the surface hydrophilic. For purposes of this application, a hydrophilic segment is defined as a moiety of a polymer that can be generally described as charge polarized, or polar, and capable of hydrogen bonding with, for example, water molecules. When used in describing a substrate, a hydrophilic substrate is one that is wettable upon contact with a polar liquid, such as water.

Such reactivity is desirably achieved by coating the at least one of the mating surfaces of the strips 36 with a composition that is capable of activating the surface so as to impart bondability to the surface. The chemical composition applied as a coating to at least one of the mating surfaces of the strips 36 may comprise a composition that is capable of releasing a pendant molecule or group, such as upon heating, and is desirably a composition containing a labile hydrogen group. Examples of suitable chemical compositions include alcohols, thiols, silanes, anhydrides, acids, and amines. A non-limiting example of a particularly useful chemical composition comprises polyhedral oligomeric silsesquioxane. This composition is available with various functionalities and is thermally stable. Such silsesquioxanes are particularly useful in such applications due to the Si—O—Si backbone structure of the compositions, which, after release of labile groups, provides for an effective covalent Si—O—Si bond between the two substrate surfaces, which is particularly compatible with the silicon substrate material as well as any $SiO_2$ dielectric surfaces of the substrate.

As discussed above, the nature of the covalent bond between the strips 36 is such that there is no intervening or separate mechanical adhesive material located between the strips, and the substrates are essentially touching each other. The bond is essentially monolithic, because the resultant product produces a single structure instead of separate substrates joined by an adhesive layer.

The chemical material may be coated onto one or both of the mating surfaces of the strips 36 by an coating device 50, as shown in FIG. 2 and by any known process such as spray coating, spin coating, transfer coating, inkjet printing, and the like. An inkjet or inkjet printing process simply uses an inkjet printer to apply the chemical material directly onto a pre-diced wafer. During inkjet printing, the chemical material is loaded into a cartridge in an inkjet printer, such as those manufactured by FUJIFILM Dimatrix®, Inc., a pre-diced wafer is fed through the printer, and the printer dispenses the chemical material onto the surface of the pre-diced wafer. The chemical material should have a viscosity suitable for use in inkjet printers which is typically between 1 and 20 cps, such as 2 to 10 cps.

After application of the chemical material, the mating surfaces of the strips 36 are brought into contact with one another and low temperature heat is applied to cause the labile hydrogen of the chemical material coated on a mating surface 38 of at least one of the strips 36 to react with the mating surface 39 of the other strip to form a covalent Si—O—Si bond. Heating the mated strips occurs at a temperature which is sufficient to cause reaction of the labile pendant group directly at the mated surfaces, thereby forming a covalent bond between the substrates as generally indicated as 54 in FIG. 4. The heating temperature must be sufficiently low to avoid damaging the strips 36 themselves as well as any component of the strips, such as any electrical connections thereon. Preferably, the heating occurs at a temperature of approximately 200° C. or less and in some instances approximately 175° C. or less, to prevent any reflow of solder that may be present on the chip die. The heating step is conducted for a time and temperature sufficient to release the labile pendant group, and thereby create a covalent bond between the strips. Since the structure of this bond is essentially monolithic, the bond-line thickness is generally on the order of 5 μm or less or within the range of 0.1-5 μm, thereby establishing an essentially zero bond-line thickness 54.

The zero bond-line thicknesses achieved by the present invention enable one to produce semiconductor products having thinner and more compact electrical components. The processing can occur at the low-temperature "back" end processing and/or packaging stage of production without causing damage to the electrical components. These compact electrical components can be formed from die stacks having eight, sixteen, or even more number of die within a stack.

According to the present invention, rejected or "inked" die, if they exist, can end up in the stack. A wire bond algorithm can be designed to skip any shingle in the stack that has been inked on the pads during wafer level electrical testing. The known good die (KGD) in the stack still function. A sort routing at the package level electrical testing can label each package based on its functional memory capacity.

The present invention has numerous advantages over known semiconductor processing. For example, the present invention has a fewer number of processing steps and less handling of the individual die. As industry demands the die to become thinner, the die become more fragile. Thus, less handling of the die results in less damage to the die. Additionally, stacks having very thin bond-lines, i.e. approximately 5 μm or less, particularly within the range of 0.1-5 μm, can be achieved, reducing the overall thickness of the shingle stack package.

What is claimed is:

1. A shingle stacked die package comprising: a plurality of individual die stacked in a shingle configuration and a labile hydrogen containing chemical coating located between each of the individual die.

2. A bonded shingle stacked die package comprising a plurality of individual die stacked in a shingle configuration and covalently bonded at their bond-line through a labile hydrogen containing compound.

3. The bonded shingle stacked die package of claim 2 in which the bond-line thickness between the individual die is approximately 0.1-5 μm or less.

4. The bonded shingle stacked die package of claim 2 in which the labile hydrogen containing compound is a silsesquioxane.

\* \* \* \* \*